United States Patent [19]
Gregory et al.

[11] Patent Number: 4,691,077
[45] Date of Patent: Sep. 1, 1987

[54] ANTIREFLECTION COATINGS FOR SILICON SOLAR CELLS

[75] Inventors: James A. Gregory, Sudbury; Jack I. Hanoka; Zinovy Y. Vayman, both of Brookline, all of Mass.

[73] Assignee: Mobil Solar Energy Corporation, Billerica, Mass.

[21] Appl. No.: 733,712

[22] Filed: May 13, 1985

[51] Int. Cl.$^4$ .................. H01L 31/06; H01L 31/18
[52] U.S. Cl. ..................................... 136/256; 136/261; 357/30; 357/52; 357/91; 250/492.2; 427/74; 437/2; 437/20
[58] Field of Search ............... 136/256, 258 PC, 261; 148/1.5; 250/492.2; 357/30, 52, 91; 427/74, 94; 29/572, 576 B

[56] References Cited
U.S. PATENT DOCUMENTS
4,557,037 12/1985 Hanoka et al. .................. 29/576 B Primary Examiner—Aaron Weisstuch
Attorney, Agent, or Firm—Schiller, Pandiscio & Kusmer

[57] ABSTRACT

An improved optical match to a subsequently-formed antireflection overcoating is achieved by providing a silicon solar cell substrate with an altered surface layer that is formed by an ion-beam process, and has a refractive index between about 3.4 and about 3.6 at 633 nm and between about 3.6 and about 3.8 at 442 nm. The surface layer is formed by adding between about 2% and about 10% methane, by volume, to the hydrogen flow in a Kaufman type broad beam ion source.

14 Claims, 1 Drawing Figure

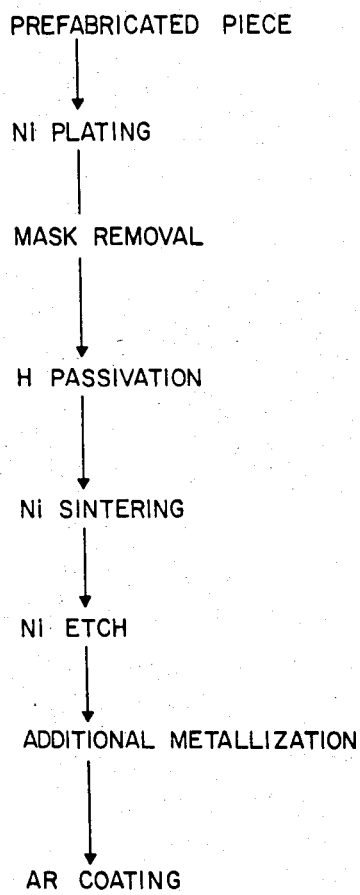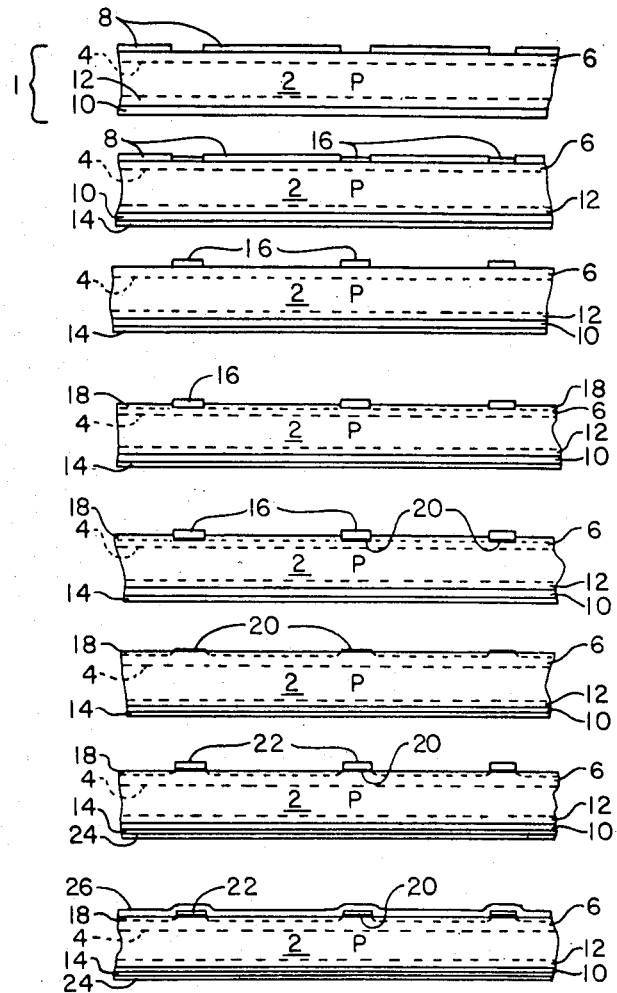

ANTIREFLECTION COATINGS FOR SILICON SOLAR CELLS

BACKGROUND OF THE INVENTION

This invention pertains to antireflection coatings for silicon solar cells and more particularly to such coatings incorporating the altered layer formed on polycrystalline silicon as a result of hydrogen ion-beam passivation.

As is well known, cost considerations make it desirable to fabricate silicon solar cells from polycrystalline, rather than monocrystalline, silicon. However, because of the minority carrier losses at grain boundaries, dislocations, and the like, the efficiencies realized with polycrystalline silicon solar cells are generally poorer than those of monocrystalline cells. This circumstance has been improved upon by introducing a monovalent element, such as hydrogen, into the polycrystalline material to combine with the dangling bonds associated with the structural defects, thereby minimizing the minority carrier recombination loss.

A variety of manufacturing protocols have been developed to integrate a hydrogen passivation step into the volume manufacture of solar cells. For instance, as taught in U.S. Patent applications Ser. No. 681,003, filed 13 Dec. 1984 (which is a continuation-in-part of U.S. patent application Ser. No. 659,279, filed 10 Oct. 1984, abandoned, which is a continuation of U.S. patent application Ser. No. 563,061, filed 19 Dec. 1983, abandoned), and U.S. patent application Ser. No. 681,001, filed 13 Dec. 1984 (which is a continuation-in-part of U.S. patent application Ser. No. 666,972, filed 31 Oct. 1984, abandoned, which is a continuation of U.S. patent application Ser. No. 563,292, filed 19 Dec. 1986, abandoned), and U.S. Pat. No. 4,557,037 (issued on U.S. patent application Ser. No. 681,498, filed 13 Dec. 1984, which is a continuation-in-part of U.S. patent application Ser. No. 666,973, filed 31 Oct. 1984, abandoned, which is a continuation of U.S. patent application Ser. No. 563,132, filed 19 Dec. 1983, abandoned) the hydrogen passivation may be. incorporated into the manufacturing process so as to form a plating mask for the control of subsequent metallization of the front surface electrodes. Thus, as described in U.S. patent application Ser. No. 681,003 a preferred embodiment of the process described in detail therein as applied to the manufacture of silicon solar cells involves, inter alia, the following steps: (1) forming a plating mask of a dielectric material on the front surface of a shallow-junction silicon ribbon so as to leave exposed those areas of the silicon to be covered by the front surface electrode, (2) depositing a thin layer of nickel (or similar material) on the exposed silicon, thereby forming an initial metal layer in the electrode pattern, (3) removing the plating mask, thereby exposing the silicon between the initial metal layer of the front electrode, (4) hydrogen ion-beam passivating the junction side of the cell in such a way as to form, inter alia, a fresh plating mask on the silicon between the electrodes, (5) sintering the nickel to form in part a nickel silicide, (6) plating additional metal(s) onto the metal-covered portions of the cell, and (7) applying or forming an antireflection coating on the exposed surface of the silicon. Thereafter, the silicon may be further processed, e.g., to prepare it for connection to electrical circuits. In an alternative process, the heating of the sample during passivation supplies at least part of the energy for the nickel sintering step. Related proceedures are taught in U.S. patent applications Ser. Nos. 681,001 and 681,498 (now U.S. Pat. No. 4,557,037).

A number of other ion-beam passivation proceedures are also known, and it should be noted that the passivation step need not be used to form a plating mask. In any event, it has been found that, as a result of hydrogen ion-beam passivation, an altered surface layer is formed on the silicon (for the proceedures cited hereinbefore, this altered layer is used as the subsequent plating mask), and that this layer has a refractive index lower than that of untreated silicon. Accordingly, the refractive index of an ideal antireflection coating that overcoats such a layer should also be lower than for virgin silicon.

For example, as is well known, the refractive index, $n_1$, of a quarter wave antireflection coating should relate to the indices $n_0$ and $n_2$ of the materials on either side of it by the relationship $$n_1^2 = n_0 n_2$$

For such an antireflection coating separating air and silicon, $n_0 = 1.000$ and $n_2$ is the index of refraction of the silicon. For virgin silicon, $n_2 = 3.78$ at 633 nm, and consequently, a quarter wave antireflection coating having an index of 1.95 is ideal. It is well known that such an index may be achieved with a silicon nitride coating, which, by appropriate plasma deposition protocols, may be made to have refractive indices between about 1.85 and 1.95. Thus, virgin silicon may be easily optically matched to air with a practical coating procedure.

In contrast, the altered layer formed as a result of hydrogen ion-beam passivation has a refractive index much lower, values as low as 3.17 at 633 nm having been observed. An ideal quarter wave antireflection coating for air would accordingly have an index of 1.78, well below the index achievable with silicon nitride. If a silicon nitride antireflection coating were used, there would be an optical mismatch, and the efficiency gains made through the minimization of the minority. carrier recombination losses by hydrogen passivation would be partially offset by increased Fresnel losses.

A possible solution would be to use other, less desirable, antireflection coatings having lower refractive indices. However, the situation is exacerbated since it is also found that the effective refractive index of the altered layer formed in ion-beam passivation varies from sample to sample.

Stripping the altered layer from the workpiece, as by etching, is another possible approach. However, the additional processing step is not desirable in a production process.

It might also be noted that while adding an antireflection coating to a cell is desirable from the standpoint of cell performance, it is an additional step, and therefore an additional expense, in the manufacturing process.

OBJECTS OF THE INVENTION

Accordingly, it is an object of the present invention to provide an altered surface layer via ion-beam passivation having an index of refraction more closely optically matching the antireflection coatings of choice.

It is a further object of the invention to provide an altered surface layer having a predictable, substantially constant, index of refraction.

It is also an object of the present invention to provide a solar cell with reduced Fresnel losses yet fabricated by a process that does not require the addition of an antireflection coating.

Another object is to provide a method of producing solar cells wherein hydrogen passivation is employed to facilitate control of antireflection characteristics.

BRIEF DESCRIPTION OF THE INVENTION

The various processes hereinabove described are futher improved by the process taught in U.S. patent application Ser. No. 733,710, filed concurrently herewith, where it is shown that a more consistent quality plating mask, and consequently an improved yield of processed pieces, may be realized by a controlled release of a small amount of a low moleoular weight hydrocarbon vapor into the vacuum system of the Kaufman-type ion source used for passivation. The amount of hydrocarbon introduced is between about one third of one percent and about ten percent, relative to the hydrogen flow, depending on the hydrocarbon.

It has now been found that if the hydrocarbon is methane, the index of refraction of the damaged layer may be controlled, and also may be made to provide a better optical match to a subsequent overcoating of silicon nitride.

Other objects of the invention will in part be obvious and will in part appear hereinafter. The invention accordingly comprises the several steps and the relation of one or more of such steps with respect toeach of the others which are exemplified in the following detailed disclosure, and the scope of the application of which will be indicated in the claims.

BRIEF DESCRIPTION OF THE DRAWING

For a fuller understanding of the nature and objects of the present invention, reference should be had to the following detailed description which is to be considered together with the accompanying drawing whch illustrates a number of the steps involved in making solar cells according to a preferred form of the invention.

Throughout the drawing, like reference numbers refer to similar structure.

In the drawing, the thicknesses and depths of the several coatings and regions are not shown to scale noli exactly in accordance with their relative proportions, for convenience of illustration.

DETAILED DESCRIPTION OF THE INVENTION

Referring now to the drawing, the preferred embodiment of the invention relates to the production of solar cells from EFG grown P-type silicon ribbon. For this embodiment, there is provided as a starting piece a partially finished cell 1. Partially finished cell 1 has a substrate 2, preferably formed from a P-type conductivity silicon ribbon, one side (hereafter the "front side") of which has been provided with a relatively shallow junction 4 (i.e., a junction of between about 3,000 and about 7,000 Angstrom units deep), an N-type conductivity region 6, and a mask 8. Mask 8 is of a material (e.g., a dielectric) to which metals, such as nickel, will only poorly adhere, and is configured to expose portions of the front surface of substrate 2 in a pattern of a multi-fingered grid electrode (e.g., an electrode having the form illustrated in U.S. Pat. No. 3,686,036). The other side (hereafter the "rear side") of the substrate is preferably provided with a layer 10 of aluminum alloyed to the substrate and a P+ region 12. The P+ region 12 preferably has a depth of from about 1 to about 5 microns.

Partially finished cell 1 may be fabricated by and of a number of means well known in the art. For instance, junction 4 and region 6 may be formed in a P-type silicon substrate 2 by the diffusion of phosphorus, and mask 8 may be formed on the front surface thereof by photolithography or printing. Thus, for instance, a layer of phosphosilicate glass, formed as detailed in U.S. Pat. No. 4,152,824, may be used as a source for the phosphorous dopant, the glass layer than being appropriately masked and etched through in part using a buffered HF solution so as to form mask 8. Layer 10 and P+ region 12 may be formed by coating rear side of the substrate with a layer of an aluminum paste comprising aluminum powder in a voatile organic vehicle, such as terpineol, that can beremoved by evaporation, and then heating the substrate to remove any volatile or pyrolyzable organic components of the paste and to alloy the aluminum to the substrate and form the P+ region. However, other forms of substrate, junction, and rear electrode, and other methods of fabrication, may equally well be employed to provide partially finished cell 1.

Starting with such a prefabricated piece, both sides of the substrate are first plated with nickel, an adhesive deposition of nickel forming a nickel layer 14 on the back side of the piece over the entire area of aluminum layer 10, while the adhesive deposition of nickel on the front side forms a layer 16 directly on the surface of substrate 2 only on those areas exposed through mask 8. Plating of the nickel layers may be done in various ways. Preferably it is accomplished in accordance with a known nickel plating process, e.g., a process of the type described in U.S. Pat. No. 4,321,283 of Kirit Patel, et al. As a preliminary step, the cleaned silicon substrate surface is pre-activated with a suitable agent.

This pre-activation procedure is desirable since often the silicon surface will not itself support the plating process, and any nickel plated on an untreated surface generally adheres thereto only poorly. Preferably, gold chloride is used as the activating agent, although platinum chloride, stannous chloride—palladium chloride, or other well known activators may be used, as described, for instance, in U.S. Pat. No. 3,489,603. Thereafter, both sides of the silicon ribbon are coated with a layer of nickel, preferably by immersing the ribbon in an aqueous bath of nickel sulfamate and ammonium fluoride at a pH of about 2.9 and at approximately room temperature for a period of about 2 to 6 minutes.

At this stage, mask 8 is stripped from substrate 2. Depending on the nature of the mask, this may be accomplished in any of a number of well-known ways, as, for instance, by the use of a buffered etch. As a result of the mask removal, the front surface of substrate 2 is exposed through a grid pattern formed of nickel layer 16.

Next, the cell is hydrogen passivated. A preferred method is to expose the front surface of substrate 2 (and nickel layer 16) to the hydrogen ion beam of a Kaufman-type (broad beam) ion source situated about 15 cm from the substrate. This ion source is preferably operated at a pressure of between about 1 and 50 millitorr (of hydrogen), with a hydrogen flow rate in the order of about 10 to 100 s.c.c. per minute, with a potential of about 1000 to 2000 volts d.c. between source and substrate, and with a beam current density of between about 1 and 3 milliampere/$cm^2$ at the substrate. An exposure time of between about 1 and about 4 minutes has been found adequate both to minimize the minority carrier recombination losses typically experienced with EFG-type silicon cells (providing a passivation zone some 20 to 80 microns deep, or about 100 times as deep as junction 4) and simultaneously providing an altered surface layer 18 approximately 200 Angstrom units deep on the exposed portions of substrate 2. To this point, the process is as described in U.S. patent application Ser. No. 681,003. It will be recognized that the alternative processes taught, for instance, in U.S. patent application Ser. Nos. 681,498 (now U.S. Pat. No. 4,557,037) or 681,001 (now U.S. Pat. No. 4,612,698) could also be used.

During passivation, between about 2% and about 10% by volume (relative to the hydrogen flow) of methane ($CH_4$) is introduced into the ion-beam vacuum chamber. While this range of concentrations has been found to produce the desired effect, the methane concentration, relative to the hydrogen, is preferably between about 2% and about 8% by volume. It should be noted that these levels are in addition to (and substantially greater than) the unavoidable background levels of methane commonly found as contaminants in vacuum systems, which run in the order of between about 0.2 and 1%.

The methane may be introduced into the vacuum system either in the hydrogen supply to the ion source, or via a separate gas supply line. It has been found, however, that the introduction of methane into the ion source via the hydrogen supply line, leads to a shortened lifetime of the filamentary cathode within the source.

It has been found that an altered surface layer 18 produced in accordance with this procedure with accelerating voltages between about 1000 and about 2000 volts and exposure times as short as 1 minute is sufficient to prevent subsequent metallization of the substrate over altered layer 18.

Next, the substrate is heated in an inert or a nitrogen atmosphere to a temperature and for a time sufficient to sinter the nickel layers and cause the nickel layer 16 on the front side of the substrate to react with the adjacent silicon to form a nickel silicide ohmic contact. For this purpose, the substrate is preferably heated to a temperature of about 300° C. for between about 15 and about 40 minutes. This provides a nickel silicide layer 20 with a depth of about 300 Angstrom units at the interface between nickel layer 16 and substrate 2. The nickel layer 14 on the rear side forms an alloy with aluminum layer 10. The temperature of this sintering step should not greatly exceed 300° C., as higher temperatures lead to excessive penetration of nickel layer 16 into the silicon.

Following this, the nickel of layers 14 and 16 is subjected to etching with hot dilute nitric acid, followed by ultrasonic cleaning, to remove excess nickel from both sides of the substrate. The nickel etch not only removes excess nickel but also removes some of the nickel—aluminum alloy formed on the rear side of the substrate during the sintering step. After the nickel etch step, layer 14 is characterized by an nickel—aluminum alloy layer overlying aluminum electrode layer 10 while layer 16 is stripped to expose nickel silicide layer 20 corresponding to the preselected electrode grid pattern.

Thereafter nickel silicide layer 20 and the nickel—aluminum alloy layer 14 are respectively further metallized with one or more layers 22 and 24 of a selected metal to provide suitable contacts. In these metallization steps, altered surface layer 18 of substrate 2 acts as a plating mask to prevent metal from adhering to the surface of the substrate between the pattern of the already attached nickel silicide layer 20. Preferably but not necessarily, this additional metallization involves application of a second layer of nickel to layers 14 and 20 according to one of the methods known in the art. Immediately thereafter, one or more layers of copper are applied to the exposed nickel on both sides of the substrate so as to bond to the nickel layers and thereby protect them against oxidation and to insure a high conductivity. The copper may be applied by electrolytic plating. Thereafter the device may be subjected to other treatments for known purposes, e.g., layers of tin and solder may be applied successively over the previously applied metal layers.

Following metallization, the cell edges (not shown) are trimmed, and an anti-reflection coating 26 is applied to the front surface of the cell. This latter step may be accomplished by any of a number of known methods, such as by chemical vapor deposition or evaporation of, for instance, $TiO_2$. Preferably, however, anti-reflection coating 26 is formed by the plasma deposition of silicon nitride at a temperature of between about 150° C. and 250° C. using silane and ammonia, as is well known in the art.

As already noted, altered surface layer 18 has a refractive index lower than that of untreated silicon. Accordingly, the refractive index of an ideal anti-refelection coating should also be lower than for virgin silicon. As previously noted, the refractive index, $n_1$, of a quarter wave antireflection coating should relate to the indices $n_0$ and $n_2$ of the materials on either side of it by the relationship $$N_1^2 = n_0 n_2.$$

For such an antireflection coating separating air and silicon, $n_0 = 1.000$ and $n_2$ is the index of refraction of the silicon. For virgin silicon, $n_2 = 3.78$ at 633 nm, and consequently, a quarter wave anti-reflection coating having an index of 1.95 is ideal. Silicon nitride overcoatings having such an index may be readily fabricated, and an extensive technology for such fabrication exists.

As will be described, silicon processed in the manner described hereinbefore may be made to have a surface layer with indices, at 633 nm, ranging between about 3.20 and 3.60, depending upon the ratio of $CH_4$ to $H_2$. For the ratio of $CH_4$ to $H_2$ in the range of 2 to 8 percent, indices of between about 3.50 and 3.60 are observed. These indices dictate an ideal quarter wave coating, in air, having indices in the range 1.87 to 1.90.

It is well known that the refractive indices of antireflection layers may be varied by varying the deposition procedure. For example, silicon nitride formed by plasma deposition may be made to have a refractive index of between about 1.85 and 1.95 by varying the plasma temperature, a temperature of about 240° C. producing the higher index and a temperature of about 150° C., the lower. In the same deposition process, the index of the resulting silicon nitride layer can also be varied over a similar range by changing the mix of silane and ammonia, a 1:1 $SiH_4:NH_3$ mix yielding the higher index and a 1:2 mix, the lower.

By way of example, the first steps of solar cell manufacture from EFG-grown silicon were performed in accordance with the procedure detailed above, using methane as the hydrocarbon. Passivation was accomplished by exposing the sample pieces for 1 minute to a hydrogen ion beam produced by a Kaufmann-type ion source having an accelerating potential of 1700 eV and a beam current density at the sample of between 1.5 and 2.0 mA cm$^{-2}$. Various percentages of methane were introduced along with the hydrogen to make up a flow rate of the hydrogen-methane mix of about 30 sccm at a chamber pressure of between 35 and 40 mTorr. The percentage of methane was maintained constant for each sample. The samples were not finished into solar cells.

Reflectivities, R, were measured at 633 and 442 nanometers. From ellipsometry measurements, the complex refractive indices (n+ik) were also deduced at the same wavelengths. The average results of a number of measurements of various samples are tabulated in Table I.

TABLE I

|  | 633 nm | | | 442 nm | | |
| --- | --- | --- | --- | --- | --- | --- |
| % CH$_4$ | R % | n | k | R % | n | k |
| Untreated (Control) | 35 | 3.78 | 0.14 | 44 | 4.61 | 0.39 |
| 0% | 29 | 3.17 | 0.73 | 38 | 3.75 | 1.42 |
| 2 | 32 | 3.43 | 0.75 | 40 | 3.72 | 1.49 |
| 4 | 33 | 3.55 | 0.73 | — | 3.82 | 1.51 |
| 5 | 32 | 3.48 | 0.75 | 40 | 3.76 | 1.60 |
| 8 | 33 | 3.49 | 0.80 | 40 | 3.66 | 1.62 |
| 10 | 33 | 3.50 | 0.79 | 40 | 3.71 | 1.64 |

It will be noted that both the reflectivities and the refractive indices are lower for the passivated samples than for the control. In the case of the samples passivated without added methane, the real part of the index of refraction at 633 nm is 3.17, and the ideal quarter wave antireflection coating for air would accordingly be 1.78, well below the index of silicon nitride. In contrast, the non-passivated control's index of 3.78 has an ideal match of 1.95, at the high end of the range achievable with silicon nitride. For a methane concentration between 4% and 8%, the index of the passivated samples range from 3.48 to 3.55, and the corresponding indices of an ideal quarter wave antireflection coating in air range from 1.87 to 1.89, mid range in the indices achievable with a desirable silicon nitride coating.

It is clear that the altered surface layer 18 made in accordance with the process described hereinabove has advantageous optical properties. Such a layer better matches a silicon nitride quarter wave anti-reflection coating than does the altered layer formed by prior art ion-beam hydrogen passivation. Furthermore, the altered surface layer resulting from the introduction of between 2% and 8% methane affords an easier match to a silicon nitride antireflection coating than does virgin silicon, inasmuch as the ideal quarter wave coating for the so treated silicon is in the middle of the range of indices that may be achieved with silicon nitride, while that for the untreated is at the extreme. Thus, cells incorporating the altered surface layer of the present invention may be better or more easily matched to a silicon nitride antireflection coating than either a non-passivated cell or a cell passivated in accordance with the prior art ion-beam procedure.

It will be understood that a number of modifications may be made to the process without departing from the scope of the invention herein descibed. Thus, while the preferred method detailed herein makes use of a removable plating mask for the initial metallization of the front surface, the initial mask being removed prior to passivation, the passivation step may be used to form the initial mask,, as detailed U.S. patent applications Ser. Nos. 681,001 (now U.S. Pat. No. 4,612,698) or 681,498 (now U.S. Pat. No. 4,557,037). Then, too, it is clear that altered surface layer 18 may be used solely as an antireflection layer, the front electrode plating being controlled by other means.

Of course, while the preferred embodiment allows a more desirable optical match between the surface of the silicon piece and a subsequent antireflection coating, it can be used for and might even be desirable for certain purposes, as, for instance, to achieve a match with a different antireflection coating, or indeed, to dispense with a coating altogether.

Of course, the process provided by this invention is not limited to the production of solar cells from EFG substrates. Thus, for example, cast polycrystalline substrates, epitaxial silicon on metallurgical grade silicon, or fine grade polysilicon layers formed by chemical or physical vapor deposition can be used to form solar cells according to the present invention. Further, the process is applicable to single crystal silicon. Then, too, the process may be practiced with N-type as well as P-type material. Also, the invention may be applied to substrates other than ribbons or similar flat stock, e.g., circular pieces of material or substrates having arcuate or polygonal cross-section.

Further, the method might be employed in the fabrication of Schottky barrier devices, the altered surface layer serving as a mask for the metallization. For such applications, it will be understood, the metal-substrate interface is the junction, and the substrate consequently would not be provided with a junction by diffusion of phosphorus or the like.

Since these and other changes may be made in the above processes without departing from the scope of the invention herein involved, it is intended that all matter contained in the above description or shown in the accompanying drawing shall be interepreted in an illustrative and not a limiting sense.

What is claimed is:

1. In a silicon solar cell having a grid electrode on one side thereof, the improvement comprising a surface layer of modified silicon having a refractive index of about 3.4 to 3.6 at 633 nm and about 3.6 to 3.8 at 442 nm, said surface layer being formed at said one side thereof by hydrogen ion-beam implantation in the presence of between about 2% and about 10% methane, by volume, relative to the hydrogen.

2. In a method for manufacturing silicon solar cells, the improvement comprising subjecting one side surface of each cell to hydrogen ion-beam implantation in a vacuum chamber while introducing into said vacuum chamber methane with a volume flow rate of between about 2% and about 8% that of the hydrogen flow.

3. In a method for treating silicon substrates for the preparation of silicon solar cells, the improvement comprising subjecting said substrates to hydrogen ion-beam implantation in the presence of methane so as to form an altered surface layer, and thereafter depositing an antireflective coating over said altered surface layer, said altered surface layer having a refractive index that provides an optimum optical match between said antireflective coating and silicon.

4. In a method for manufacturing silicon solar cells using silicon substrates, the improvement comprising subjecting each substrate to hydrogen ion-beam implantation in a vacuum chamber while introducing methane into said vacuum chamber at a volume flow rate of between about 2% and 8% of the volume flow rate of hydrogen so as to form an altered surface layer on each substrate, and thereafter forming on said altered surface layer anti-reflection coating having a refractive index in air ranging from about 1.87 to about 1.89, said altered layer having a refractive index that provides an optimum optical match between said silicon substrate and said anti-reflection coating.

5. Method according to claim 4 wherein said anti-reflection coating is silicon nitride.

6. Method according to claim 4 wherein said hydrogen ion-beam implantation is conducted with a hydrogen ion source and a potential between said source and said substrates of between about 1000 to about 2000 volts d.c. and a beam current density of between about 1 and 3 milliamperes/cm$^2$ at said substrates.

7. A silicon solar cell comprising a silicon substrate and a hydrogen-modified silicon surface layer at one side of said substrate having a refractive index of about 3.4 to 3.6 at 633 nm.

8. A silicon solar cell comprising a silicon substrate and a hydrogen-modified silicon surface layer at one side of said substrate having a refractive index of about 3.6 to 3.8 at 442 nm.

9. A silicon solar cell comprising a silicon substrate having a surface layer of modified silicon having a refractive index of about 3.4 to 3.6 at 633 nm and about 3.6 to 3.8 at 442 nm, said layer being formed by placing said substrate in an ion beam vacuum chamber, and subjecting said substrate to hydrogen ion-beam implantation in said ion beam vacuum chamber, said implantation involving introducing into said chamber a mixture of hydrogen and methane with the concentration of methane being between about 2% and about 10% by volume relative to hydrogen.

10. A silicon solar cell according to claim 9 further comprising an anti-relection coating overlying said surface layer of modified silicon.

11. A silicon solar cell according to claim 10 wherein said anti-reflection coating is silicon nitride.

12. In a method for treating a silicon substrate for the preparation of silicon solar cells, the improvement comprising subjecting a selected surface of said substrate to hydrogen ion-beam implantation in a vacuum chamber while introducing into said vacuum chamber a mixture of hydrogen and methane with the concentration of methane being between 2% and about 10% by volume relative to the volume of hydrogen, so as to achieve a layer of modified silicon at said selected surface, and thereafter coating said layer with an anti-reflection coating, said layer of modified silicon being formed so as to have a refractive index that provides an optimum optical match between said silicon substrate and said anti-reflection coating.

13. A method according to claim 12 wherein said surface layer has a refractive index of about 3.4 to 3.6 at 633 nm and about 3.6 to 3.8 at 442 nm.

14. A method according to claim 12 or 13 wherein said anti-reflection coating is silicon nitride.

* * * * *

UNITED STATES PATENT AND TRADEMARK OFFICE
CERTIFICATE OF CORRECTION

PATENT NO. : 4691077
DATED : September 1, 1987
INVENTOR(S) : James A. Gregory et al It is certified that error appears in the above-identified patent and that said Letters Patent is hereby corrected as shown below:

Claim 4, column 9, line 1, the word "an" should be inserted after the word -- layer --.

Signed and Sealed this

Twelfth Day of January, 1988

Attest:

DONALD J. QUIGG

*Attesting Officer*

*Commissioner of Patents and Trademarks*